United States Patent [19]
DiPerna

[11] Patent Number: 4,884,024
[45] Date of Patent: Nov. 28, 1989

[54] TEST PIN ASSEMBLY FOR CIRCUIT BOARD TESTER

[75] Inventor: Paul M. DiPerna, North Andover, Mass.

[73] Assignee: Teradyne, Inc., Boston, Mass.

[21] Appl. No.: 38,909

[22] Filed: Apr. 16, 1987

Related U.S. Application Data

[63] Continuation-in-part of Ser. No. 799,460, Nov. 19, 1985, abandoned.

[51] Int. Cl.⁴ ................. G01R 31/02; G01R 15/12
[52] U.S. Cl. ......................... 324/158 F; 324/73 PC; 324/158 P
[58] Field of Search ........... 324/158 F, 158 P, 73 PC, 324/72.5; 439/280, 374, 296

[56] References Cited

U.S. PATENT DOCUMENTS

| 4,132,948 | 1/1979 | Katz | 324/158 F X |
| 4,230,985 | 10/1980 | Matrone et al. | 324/73 PC X |
| 4,321,532 | 3/1982 | Luna | 324/158 P X |
| 4,322,682 | 3/1982 | Schadwill | 324/158 F X |
| 4,352,061 | 9/1982 | Matrone | 324/158 F X |
| 4,357,062 | 11/1982 | Everett | 324/158 F |
| 4,528,500 | 7/1985 | Lightbody et al. | 324/158 P |
| 4,544,881 | 10/1985 | Saroul | 324/73 PC |
| 4,642,560 | 2/1987 | Morille et al. | 324/73 PC |
| 4,799,007 | 1/1989 | Cook et al. | 324/158 P |

FOREIGN PATENT DOCUMENTS

| 0050913 | 5/1982 | European Pat. Off. . |
| 0115135 | 12/1983 | European Pat. Off. . |
| 3115787 | 11/1982 | Fed. Rep. of Germany . |
| 3300247 | 7/1983 | Fed. Rep. of Germany . |

Primary Examiner—Reinhard J. Eisenzopf
Assistant Examiner—Vinh P. Nguyen

[57] ABSTRACT

Apparatus for testing the electrical integrity of printed circuit boards under test (BUTs), each BUT having a plurality of downwardly directed accessible nodes, the apparatus including support means for removably supporting the BUT, test circuitry including a plurality of upwardly directed channel nodes below the support means, connection means for electrically connecting the channel nodes to the BUT nodes, the connection means including a universal board carrying probes in a universal grid pattern, means to activate selective probes, and a translator board to make electrical connection between upper and lower conductors in different patterns.

8 Claims, 3 Drawing Sheets

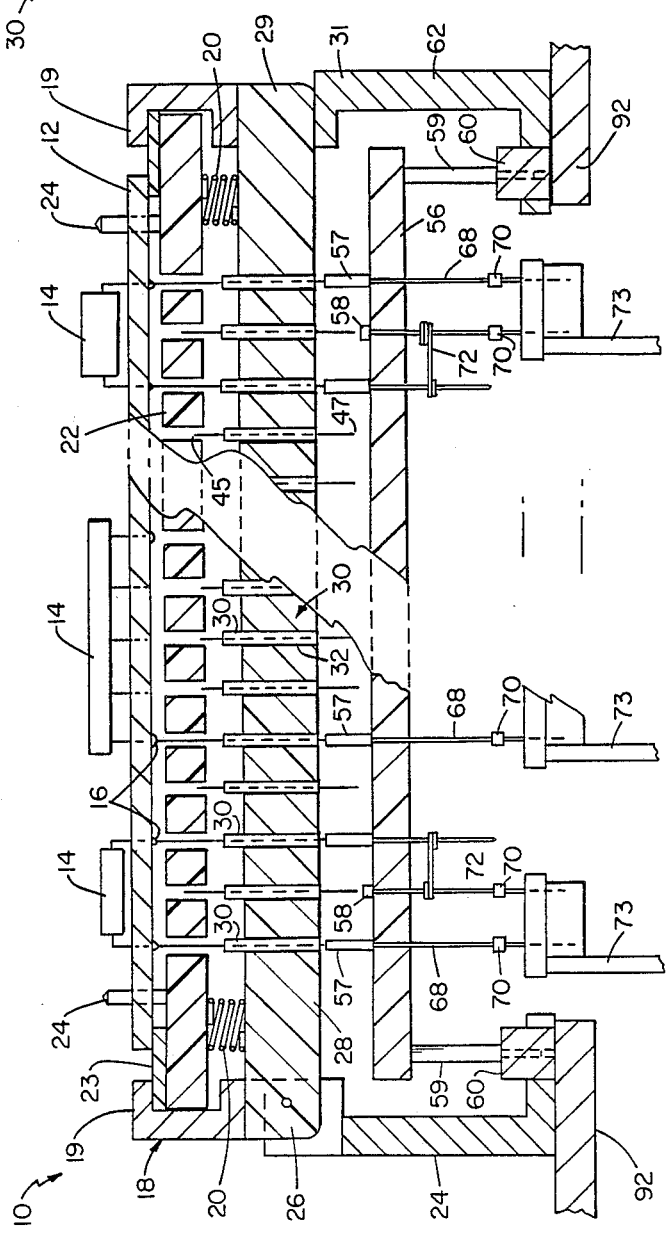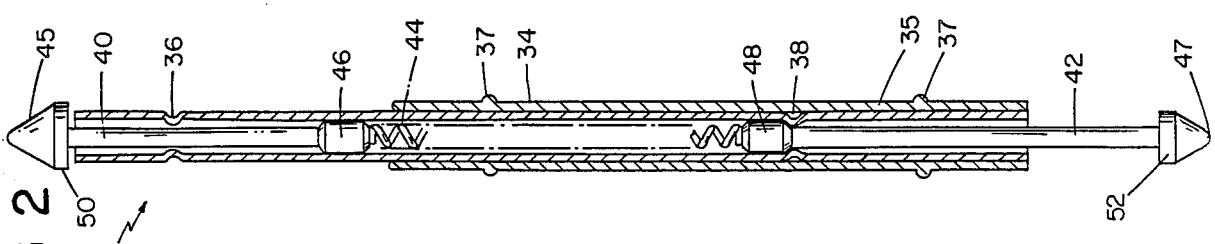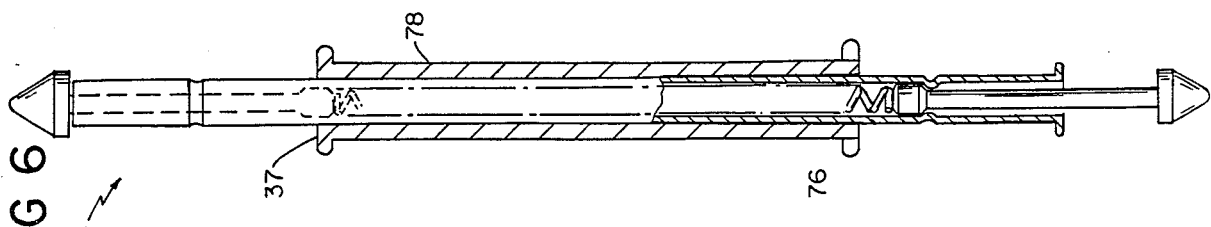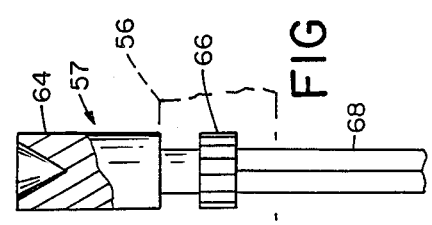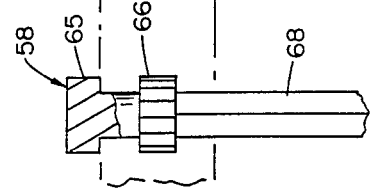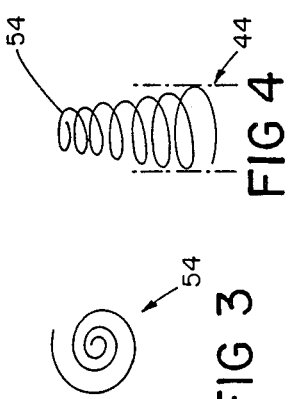

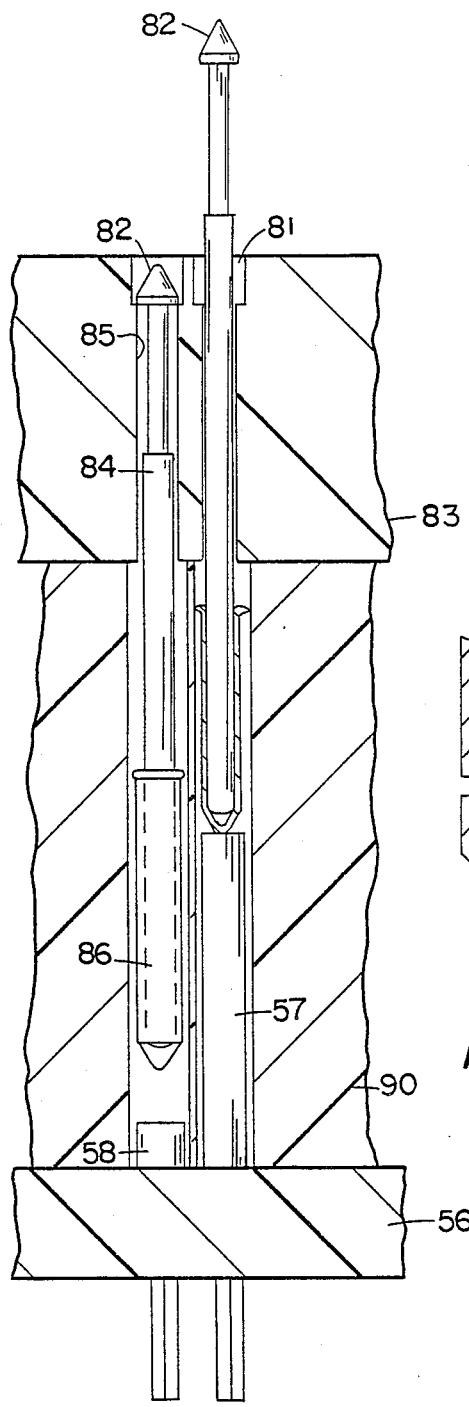
FIG. 7
FIG. 10
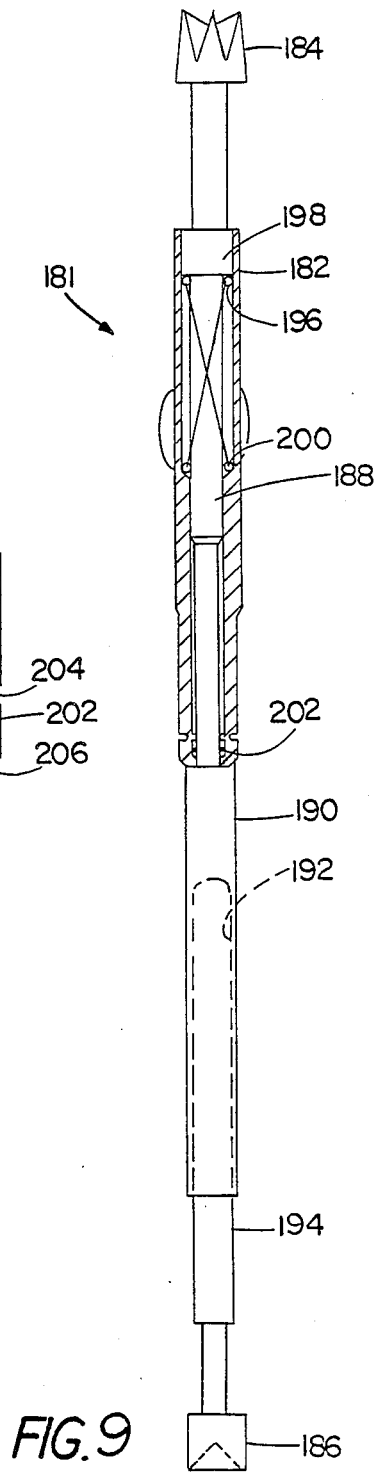
FIG. 9

TEST PIN ASSEMBLY FOR CIRCUIT BOARD TESTER

This is a continuation-in-part of U.S. Ser. No. 799,460, filed Nov. 19, 1985, now abandoned.

FIELD OF THE INVENTION

The invention relates to apparatus for testing printed circuit boards.

BACKGROUND OF THE INVENTION

Printed circuit boards (PCB's) loaded with the components they were designed to carry are often tested for electrical integrity by using spring-loaded test pins that are vertically supported underneath a PCB under test (BUT) in position to contact the exposed nodes on the bottom surface of the BUT.

For example, Katz U.S. Pat. No. 4,132,948 discloses mounting test pins in an unloaded PCB having an identical hole pattern to that of the BUT so that the test pins automatically line up with the nodes being contacted. The test pins are directly connected to wires that are connected via cable assemblies to the test circuitry. When the circuit board tester is to be used to test PCB's having a different node pattern, the test pin support board is replaced with one having test pins corresponding to the node locations for the new PCB design.

Published European Patent Application No. 0 115 135 discloses a test fixture including a permanent base sheet carrying a large number of test pins and a lower customizing board that carries inserts that activate test pins at selected locations to be raised into activated position to contact nodes of a BUT. When used with a different BUT, a new customizing board, having inserts in the same pattern as that of the nodes of the new BUT, is installed. Underneath the customizing board, wire wrap post extensions of the inserts are wired to terminals at the side of the customizing board, for connection to test circuitry.

Published European Patent Application No. 0 050 913 discloses a test fixture including a general purpose platform that carries test pins in a uniform grid pattern and a backing plate that carries removable displacement modules that activate test pins at selected locations to contact nodes of a BUT. On the other side of the backing plate are wire-wrap posts that are electrically connected to the test pins through the modules and are wired to a multiple pin plug at the edge of the backing plate.

In some prior art test systems channel circuit boards containing instruments for providing test signals to the BUT's and receiving resulting outputs were physically located underneath the test pins to reduce the distance between the instruments and the BUT to reduce distortions to test signals and outputs. In such systems there were a plurality of upwardly directed channel nodes at connectors at the upper ends of a plurality of channel boards (also referred to as channel cards), the channel nodes being electrically connected by wires to respective test pins carried on a test pin support board like that shown in Katz U.S. Pat. No. 4,132,948. The test pins were wired to upwardly directed right angle posts on small boards, the lower plated edges of which were in turn connected to zero-insertion force edge card connectors mounted on the channel cards. Before making the wire wrap connection to the right angle posts, the small boards carrying them were removed and turned upside down so that the posts were directed downward, the same direction as lower extensions of the test pins, to facilitate wire wrapping, and after wire wrapping, the small boards were rotated back and mounted in the edge card connectors with the wires folded over. In these systems, when a particular automatic tester was used with different types of BUT's having nodes at different locations, new test pin support boards were installed. A particular model automatic tester could be provided with different channel boards having different instrumentation, depending on the type of BUTs to be tested, and a user might want to add or modify channel boards, with the result that there would be different channel nodes for the same model of tester, and possibly even the same machine at different times.

In another prior art system, dual-ended test pins mounted on a probe plate in one pattern were electrically connected to probes connected to test circuitry in another pattern below the probe plate by a translator board between the two carrying upwardly directed wire wrap posts in position to contact lower spring-biased contacts of the dual ended test pins, downward extending wire wrap posts in position to contact lower test circuitry probes, and wires between various wire wrap posts.

SUMMARY OF THE INVENTION

In one aspect my invention features in general a printed circuit board tester in which electrical connection can be desirably made between spring-biased board under test (BUT) contacts in a first pattern of predetermined locations corresponding to the nodes of a BUT and channel nodes of test circuitry circuit boards in a region below the test pins in a different pattern by using a translator board having both tubular housings carrying the spring-biased BUT contacts extending from its upper surface and lower conductors extending from its lower surface and aligned with the channel nodes and translator means electrically connecting the respective tubular housings to lower conductor members. The use of tubular housings for BUT contacts and lower conductors on a common translator board permits one to make electrical connection between BUT contacts and channel nodes in different patterns simply and directly, facilitating signal integrity in the path from the BUT nodes to test circuitry on the channel boards.

In preferred embodiments the lower conductors are wire wrap posts that extend through holes in a keeper plate below the test pin support board; and there is an interface assembly below the keeper plate making electrical connection to the channel nodes.

In another aspect my invention features providing a translator board (for making electrical connection between upper conductors in one pattern and lower conductor in another) below a universal test pin support board having test pins in a grid pattern of possible BUT locations, the translator board carrying displacement members for actuating selective test pins corresponding to node locations for the particular BUT. When used with a different BUT, a new translator board is used to both actuate only those test pins that correspond to the positions of the BUT nodes and to make electrical connection between them and the respective test circuitry channel nodes.

In another aspect my invention features a printed circuit board tester in which a universal board having spring biased interface contacts in a universal grid is used to make electrical connection between test pins and channel nodes of test circuitry, the channel nodes being in an application specific pattern that is a subset of the universal grid. Displacement members in the same pattern as the channel nodes are used to move into actuated position only those spring biased contacts that are needed to connect to the channel nodes. When the channel nodes are changed, e.g., when the instrumentation on the channel circuit boards is changed to change instrumentation, a different pattern of channel nodes can be easily accommodated by simply using different interface contacts on the universal board.

Other features and advantages of the invention will be apparent from the following description of preferred embodiments thereof and from the claims.

DESCRIPTION OF THE PREFERRED EMBODIMENTS

The drawings will be briefly described first.

Drawings

FIG. 1 is a diagrammatic vertical sectional view showing apparatus for testing PCB's according to the invention.

FIG. 2 is a diagrammatic vertical sectional view of a test pin assembly of the FIG. 1 apparatus.

FIG. 3 is an end view of a spring of the FIG. 2 test pin.

FIG. 4 is a side view of a portion of the FIG. 3 spring.

FIG. 5 is an elevation of a displacement pin and a low pin of the FIG. 1 apparatus.

FIG. 6 is a diagrammatic vertical sectional view of an alternative test pin assembly according to the invention.

FIG. 7 is a diagrammatic vertical sectional view of another alternative test pin assembly, shown with a modified support structure, according to the invention.

FIG. 9 is an elevation (partially in section) of a universal probe used in the FIG. 8 device.

FIG. 10 is an enlargement of a portion of FIG. 9 with the probe's plunger in a different position.

STRUCTURE

Figure 8:
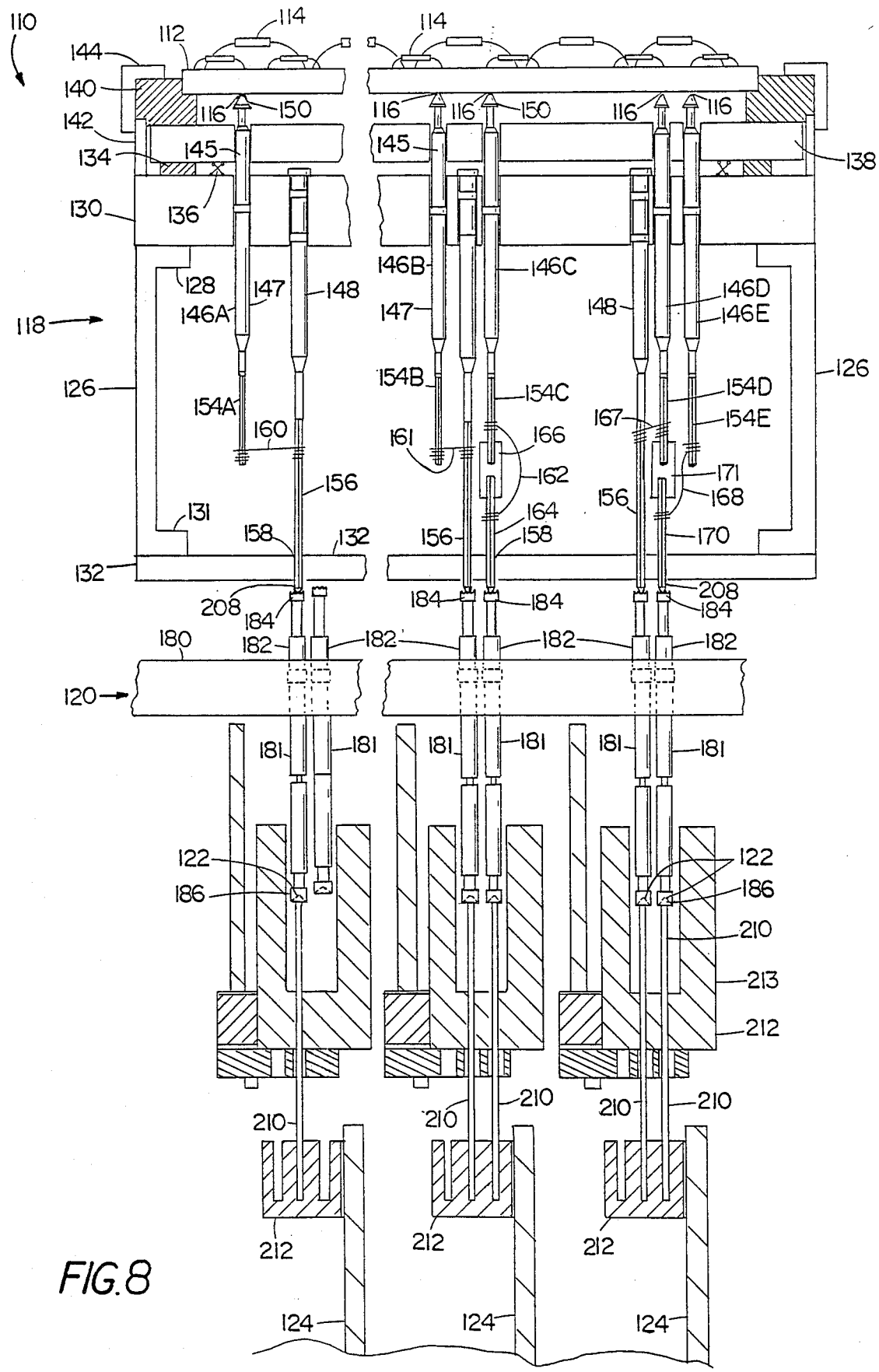
FIG. 8 is a diagrammatic vertical sectional view showing an alternative, most-preferred embodiment of apparatus for testing PCB's according to the invention.

Referring to FIG. 1, there is shown apparatus 10 for testing the electrical integrity of printed circuit board under test (BUT) 12 loaded with components 14, some of which have leads which pass through holes in the board and are soldered at nodes 16 to conductive paths printed on the bottom of board 12. Some components 14 are surface mounted (either on the top or bottom of board 12) and electrically connected to conductive pads acting as nodes without solder. Each different design for a BUT 12 has a unique pattern of nodes 16 associated with it. The nodes of BUT 12 are located on a 0.1" X-Y grid pattern; i.e., they are at locations in a unique pattern that is a subset of a universal grid pattern. (The FIG. 8 alternative embodiment is used with BUTs having nodes that are not on any grid pattern.)

Starting near the top of apparatus 10, it includes side walls 18 providing overhanging portions 19 against which 10" by 10" diaphragm plate 22 (0.187" thick fire resistant glass-filled phenolic board available under the trade designation FR4, often referred to as G-10 is biased by springs 20. Diaphragm plate 22 has 0.07" diameter holes through it spaced on 0.1" centers and rubber sealing ring 23 (⅛" high and 1" wide Neoprene) around the perimeter of plate 22 providing a vacuum seal with overhanging portion 19 and BUT 12. Two pointed ⅛" thick guidance pins 24 extend upward through corresponding holes in BUT 12 to properly align board 12. Also provided at selected locations on the surface of plate 22 are various rubber support pads (not shown) which act to seal holes in BUT 12 or support it to avoid flexing of BUT 12 during evacuation of the region below it.

Pivotally mounted on side wall 24 at pivot 26 is universal test pin support board 28 carrying test pins 30, each of which has a tubular housing 34, an upwardly directed universal BUT contact 45 and a downwardly directed actuating plunger 42 (FIG. 2). End 29 of universal board 28 is supported by ledge 31. Universal board 28 is made of two ⅛" thick glass-filled phenolic boards (same material as plate 22) spaced from each other by ¾" to provide an overall 1" thickness. Test pins 30 are mounted in holes 32 in universal board 28 located on 0.1" centers (i.e., in the universal grid pattern mentioned above) and aligned with the holes of diaphragm plate 22.

Referring to FIG. 2, it is seen that each test pin 30 includes gold-plated nickel-silver tubular housing 34, which has an outer diameter of 0.054". Housings 34 are tightly fit in 0.055" inner diameter test pin sockets 35, which are fixedly mounted in support board 28 and have shoulders 37 spaced by ¾" to provide proper spacing and structural support for universal board 28. Housing 34 is 1.470" long, and has first crimp 36 located 0.130" from its top, a second crimp 38 located 0.380" from its bottom and a dimple (not shown) holding it firmly, though removably, in test pin socket 35. Contacting plunger 40 and actuating plunger 42 are slidably carried in housing 34 with compression spring 44. Plungers 40, 42 are made of heat treated beryllium copper, gold over nickel plate, have pointed BUT contact 45 and actuating portion contact 47 for making good electrical contact, bulbous portions 46, 48, respectively, for interfering with crimps 36, 38, and overhanging shoulders 50, 52, which are larger than the diameter of housing 34. Spring 44 has an unloaded length of 0.570", and is music wire wound to 29 oz/inch. Referring to FIGS. 3 and 4, it is seen that the ends 54 of spring 44 have off-center, reduced diameter portions; this causes spring 44 and bulbous portions 46, 48 to be transversely biased against the inner surface of housing 34 only when spring 44 is compressed, in order to make good electrical contact. When spring 44 is not compressed, plungers 40, 42 and spring 44 are freely slidable in housing 34.

Returning to FIG. 1, ⅜" thick, removable actuating/translator board 56 (made of the same material as plate 22) carries beryllium copper displacement member pins 57, low pins 58 and alignment pins 59 which are received by bushings 60 carried by sidewalls 24 and 62, supported by housing 92. Each displacement member pin 57 has a 0.05" diameter, ¼" high projection 64 (FIG. 5) extending above board 56, and each low pin 58 has a 0.05" diameter, 0.08" high projection 65. The upper surfaces of projections 64 are concave so as to guide and restrain pointed ends 47 of test pins 30. Each pin 57 or 58 has a 0.068" diameter intermediate knurled portion 66, which is press fit into board 56, and a 0.025 square wire wrap post 68 extending below board 56.

Supported underneath actuating/translator board 56 are rows of sockets 70, fewer in number than test pins 30, carried by the upper ends of channel cards 73 (daughter printed circuit boards that are all supported on their lower ends by a common, horizontal backplane, not shown), and aligned with and adapted to receive and make electrical connection with selected posts 68. The selected posts 68 are either integral with projection 64 of a displacement pin 57 or connected by wires 72 to a post 68 of a displacement pin 57. Wires 72 are wrapped around overlapping translator portions that overlap each other at corresponding positions along vertical axes. Sockets 70 are electrically connected to the electronic circuitry on circuit cards 73 and other circuitry of the tester.

Referring to FIG. 8, there is shown apparatus 110 for testing the electrical integrity of BUT 112 loaded with components 114 and having nodes 116 on the lower surface that are not at locations of any grid pattern. Each different design for a BUT 112 has a unique pattern of nodes 116 associated with it. Apparatus 110 includes a fixture assembly 118, which is dedicated to a particular design for a BUT 112, and a universal interface assembly 120, which can be used with any fixture 118 and with any pattern of channel nodes 122, provided by the tops of posts 210 associated with channel cards 124.

Fixture assembly 118 includes sidewalls 126, having upper overhanging portions 128, against which translator board 130 (0.31" thick G10 material) is supported, and lower overhanging portions 131, against which apertured keeper plate 132 (⅛" thick clear Lexan polycarbonate) is supported. Supported near the periphery of the upper surface of translator board 130 are Neoprene rubber sealing ring 134 (⅛" high and 1" wide) and springs 136. Diaphragm plate 138 (0.187" G10 material) is above sealing ring 134 and springs 136. Thereabove is Neoprene rubber sealing ring 140 (3/16" high and 1" wide). Aluminimum sealing ring 142 is between the peripheries of the lower surface of sealing ring 140 and the upper surface of translator board 130. On top of sealing ring 140 is L-shaped cross section trim ring 144.

Translator board 130 includes in it upwardly extending test pins 146A-E and downwardly extending lower conducting members 148. Test pins 146A-E include tubular housings 145 (also referred to as upper conducting members) carrying spring biased BUT contacts 150 and lower extensions 147, including 0.025" square wire wrap posts 154A-E therebelow. Lower conductors 148 also include lower wire wrap posts 156, which overlap wire wrap portions of posts 154A-E and extend through holes 158 in keeper plate 132. Keeper plate 132 of fixture 118 sits on an outer Neoprene rubber sealing ring (not shown) providing a seal between it and universal interface board 180.

Three wire wrap situations are shown in FIG. 8. In the first example, shown on the left, wire wrap post 154A of test pin 146A is connected by wire 160 to the wire wrap post 156 of adjacent lower conductor 148, which is aligned with the channel node to which test pin 146A is to be connected. In the middle example, wire wrap post 154B of test pin 146B is connected by wire 161 to wire wrap post 156 of adjacent lower conductor 148, and the wire wrap post 154C of test pin 146C is electrically connected by wire 162 to wire wrap post extension 164, which is directly below test pin 146C and is physically connected by insulator sleeve 166 to post 154C. In the example on the right, test pin 146D is electrically connected by wire 167 to wire wrap post 156 of adjacent lower conductor 148, and test pin 146E is electrially connected by wire 168 to wire wrap post extension 170, which is directly below test pin 146D and physically connected by insulator sleeve 171 to post 154D.

Universal interface assembly 120 includes universal interface board 180 (⅜" thick G10 material), which is pivotally mounted at an end (by means not shown) and carries universal probes 181 comprising tubular housings 182 having universal interface contacts 184 extending upward from them. Tubular housings 182 similarly have downwardly directing actuating plungers 186. Probes 181 are located in two rows per channel card, 96 probes deep and spaced on 0.1" centers. Channel cards 124 are spaced by ¾". Referring to FIGS. 9, 10, contacts 184 are on plunger 188, which includes lower portion 190 extending from the bottom of tubular housing 182 and having recess 192 receiving test probe 194 (075 center line, 0.160 travel, cup probe). Plunger 188 is biased upward by spring 196, bearing against the lower annular surface of enlarged portion 198 and inner annular surface 200 of housing 182. Spring 196 has zero preload; at 0.09" deflection there is a 4 oz. force on contacts 184, 186. O-ring 202 (O.D. 0.075±0.002", I.D. 0.0360±0.002") provides a vacuum seal between the outer surface of plunger 188 (O.D. 0.041±0.002") and the inner surface of housing 182 (I.D. 0.070±0.002"), and is retained between roll crimp 204 and crimped end 206. A synthetic lubricant applied to O-ring 202 and the just-mentioned surfaces provides sliding. Interface contacts 184 have depressions therein for receiving the lower ends 208 of wire wrap posts 156 and extensions 164, 170. Plungers 186 similarly have depressions receiving the upper ends of posts 210 (0.025" square section), extending upward from connectors 212 of channel cards 124. Posts 210 are supported within U-shaped transverse supports 213, connected to respective channel cards 124 (by means not shown).

Operation

In operation of the FIGS. 1-5 apparatus, an actuating/translator board 56 having displacement pins 57 mounted in locations corresponding to the accessible nodes 16 of BUT 12 (i.e., their locations are at a unique pattern that matches that of BUT 12) is mounted within device 10 by sliding its guide pins 59 in bushings 60 while universal board 28 is in a raised, vertical position. Posts 68 are inserted with zero insertion force into respective sockets 70, which are then laterally translated (by a mechanism not shown) to provide good electrical connection. Universal support board 28 is then rotated to the horizontal position shown in FIG. 1 such that its end 29 is supported by ledge 31. As universal board 28 is lowered into position, the actuating plungers 42 of test pins 30 aligned with displacement pins 57 are pushed upward. As plunger 42 slides upward inside of housing 34, it pushes spring 44 upward and contacting plunger 40 and its universal BUT contact 45 through a hole in diaphragm plate 22 into the raised position, as is shown in FIG. 1. This requires no more force than the weight of the two plungers and the spring. BUT 12 is then mounted into position using guidance pins 24, and it rests on ring 23 and springs 20. A vacuum is then applied to the region underneath BUT 12, causing ring 23 and springs 20 to be compressed and BUT 12 to be lowered so that nodes 16 contact the corresponding universal BUT contacts that have been raised, compressing springs 44. Only the springs of the test pins that have been raised are compressed, limiting the force that needs to be applied to make contact.

Universal BUT contact 45 digs into the solder or contact pad at node 16, making good electrical contact. The reduced diameter ends 54 of spring 44 cause sideways biasing of bulbous portions 46, 48, making good electrical contact through test pins 30. Actuating portion contacts 47 are biased downward by spring force and similarly make good electrical contact with projections 64 of displacement pins 57. Electrical connection to electronic circuitry is made either directly to a socket 70 under a displacment pin 57 or through a wire 72 to the post of a low pin 58 that is received by a socket 70.

The electronic circuitry of the tester provides test signals to BUT 12 and senses the responses. The short, direct wire wrap connections between overlapping wire wrap portions promotes signal integrity, something becoming increasingly more important with higher speed digital circuits and obtaining precision analog measurements.

When it is desired to test a different design for BUT 12, the universal board 28 is pivoted to a vertical position, and actuating/translator board 56 is replaced with a new actuating/translator board 56 having displacement pins 57 corresponding to the nodes 16 for the new BUT 12. In this manner different PCB designs can be accommodated by merely changing actuating/translator boards 56, and there is no need to dedicate the relatively expensive test pins 30 in a particular predetermined pattern. Also, it is much easier to accommodate changes in the design of BUT 12 by changing the location of projection pins 58, than it is to change the locations of test pins and connections to tester circuitry in the dedicated test pin position testers.

In operation of the FIGS. 8-10 apparatus, fixture 118 for a particular BUT 112 is mounted on universal interface board 180, sitting on an outer sealing ring and registered by guide pins (both not shown). At this time the upper ends of those interface contacts 184 that have been raised are slightly below lower ends 208 of wire wrap posts and extensions, and the springs that bias interface contacts 184 have zero force (ignoring the weight of contacts 184) on them, as they are not preloaded. A vacuum is then applied between translator board 130 and universal interface board 180, causing compression of the sealing ring between keeper plate 132 and board 180, contact of lower ends 208 with interface contacts 184, and slight compression of springs 196. At the same time, lower contacts 186 are lowered to contact channel nodes 122, and the associated springs in probes 194 are also compressed slightly. Because interface contacts 184 are not preloaded, and only those contacts that are being used are compressed, electrical contact is made with very little force.

BUT 112 is then placed on top of the fixture, and its BUT nodes 116 are slightly spaced from BUT contacts 150. A second vacuum is applied between BUT 112 and the upper surface of translator board 130, and this causes compression of rubber rings 134, 140 and contact between BUT contacts 150 and BUT nodes 116.

BUT contacts 150 of fixture 118 are in a unique pattern that matches that of the BUT nodes 116 in the field of possible node positions of BUT 112. There similarly is a unique pattern for channel nodes 122 in a corresponding field under BUT 112; the difference in the positions of respective test pins and respective contact nodes is accommodated for by wire wrapping using wires 160, 161, 167, and 168. Wire wrap posts 156 of lower conductors 148 and wire wrap post extensions 164, 170 are in the same pattern as channel nodes 122. Signal integrity is promoted by the short, direct wire wrap connection between overlapping wire wrap post portions.

For a given model of test apparatus 110, channel nodes 122 will be in different positions depending on the instrumentation desired by the manufacturer, in turn depending on the BUTs to be tested and the desired tests. In addition, channel cards 124 and their associated channel node positions on a particular machine could be changed by adding channel cards or modifying channel cards at some point in the future. Universal interface assembly 120 would still be used with any type of channel card arrangement and with any type of fixture 118 for a BUT 112, thus standardizing and simplifying the structure of the machine.

Other Embodiments

Other embodiments of the invention are within the scope of the following claims.

For example, an alternative test pin design, test pin 74, is shown in FIG. 6. Its spring 76 has a 2.5 oz preload and a force of 5.4 oz at ⅜ travel. Test pin socket 78, which is still fixedly mounted in support board 28, has a 0.056" inner diameter, permitting 0.054" outer diameter housing 80 to slide in it. In use, displacement pins 57 push housing 80 upward, along with plungers 40, 42 and spring 76.

A further alternative design for supporting test pins is shown in FIG. 7. Here, test pin support board 83 is made of a single ½" thick support board (same material as plate 22) that has counter-sunk holes 81 for accommodating heads 82 of standard, single plunger test pins 84. Pins 84 can slide within holes 85 through board 83. Caps 86 at the lower end of pins 84 prevent the pins from falling out when support board 83 is turned upside down. Insulating honeycomb 90 is used to electrically isolate test pins 84 and align them with their respective displacement pins 57. In use, the entire test pin 84 is moved upward by a displacement pin 57.

Also, although the systems described herein have BUTS at the top and channel cards at the bottom, the inventions herein apply to other orientations.

What is claimed is:

1. Apparatus for testing the electrical integrity of a plurality of printed circuit boards under test (BUT), each said BUT having a plurality of downwardly directed accessible BUT nodes at a first pattern of predetermined locations in a first field on its bottom surface, said apparatus comprising:

support means for removably supporting a said BUT, test circuitry including a plurality of channel circuitry printed circuit boards having upwardly directed channel nodes, said upwardly directed channel nodes being directly below said support means at a second pattern of predetermined locations in a second field overlapping said first field, said second pattern not matching said first pattern of predetermined locations, connection means for electrically connecting said channel nodes to said BUT nodes, said connection means including spring-biased BUT probe contacts in a pattern that matches said first pattern so as to be aligned with and to contact said BUT nodes when said BUT is mounted on said support means, said connection means also including a translator board carrying a plurality of upper conducting members comprising tubular housings extending from an upper surface of said translator board, said tubular housings having first wire wrap posts connected to them, said upper conducting members being electrically connected to and carrying said BUT probe contacts, said translator board also carrying a plurality of lower conducting members extending downwardly from the lower surface of said translator board, said lower conducting members including second wire wrap posts, said lower conducting members being mounted in a pattern that matches that of said channel nodes, said first and second wire wrap posts having portions overlapping each other along corresponding positions of vertical axes, said connection means also including translator means electrically connecting respective said tubular housings to respective said lower conducting members, said translator means including wires connecting respective first and second wire wrap posts, said connection means also including an interface assembly between said second wire wrap posts and said channel nodes, said interface assembly comprising:

upwardly directed spring biased interface contacts making electrical connection between said second wire wrap posts and said channel nodes, and said downwardly directed plungers being carried by lower extensions of said interface contacts, there being elastomeric O-rings between said interface contacts and said tubular housings on said interface board, and an interface board carrying tubular housings carrying said spring biased interface contacts and downwardly directed plungers extending from the lower surface of the interface board and electrically connected to said channel nodes.

2. Apparatus for testing the electrical integrity of printed circuit boards under test (BUTs), each said BUT having a plurality of downwardly directed accessible nodes, said apparatus comprising:

support means for removably supporting a said BUT, spring-biased BUT contact means supported by said support means in position to contact said BUT nodes, test circuitry including a plurality of upwardly directed channel nodes, said upwardly directed channel nodes being located directly below said support means, said channel nodes being located in an application specific pattern, a universal board below said support means and above said channel nodes and carrying tubular housings in a universal grid pattern of possible channel node locations, said application specific pattern being a particular subset of said universal grid pattern, a plurality of electrically conducting displacement members supported above said channel nodes at locations in a pattern that matches said application specific pattern, said displacement members being electrically connected to said test circuitry through said channel nodes, each tubular housing carrying an upwardly directed universal contact extending from the upper surface of the universal board and having an actuating portion extending from the lower surface of said board to cause electrical connection to be made between said BUT contact means and said channel node when a displacement member is in line with said universal contact, said tubular housings and universal contacts forming seals with said universal board such that a vacuum may be created.

3. A probe comprising:

a housing, a pair of plungers extending from opposite ends of said housing, and a compression spring between said two plungers, said spring having a length between said two plungers that is shorter, when not compressed, than the distance between said plungers when they are at opposite ends of said housing, thereby allowing said pair of plungers and said spring to be free to slide in said housing.

4. The probe of claim 3 wherein said housing is made of metal.

5. The probe of claim 4 wherein said compression spring has an end that has a reduced diameter so as to transversely displace a said plunger against said housing when said spring is compressed.

6. A probe comprising a tubular housing having an inner surface, a first spring-biased plunger extending from both ends of said housing and having an outer surface that is within said housing, and an elastomeric sealing ring between said inner surface of said housing and said outer surface of said plunger, said elastomeric sealing ring completely extending all the way around said plunger, said elastomeric sealing ring providing a vacuum seal between said outer surface of said plunger and said inner surface of said housing.

7. The probe of claim 6 further comprising a second spring-biased plunger that extends from one end of said first spring-biased plunger.

8. The probe of claim 7 wherein said first spring-biased plunger has zero preload.

* * * * *